(12) United States Patent
Su et al.

(10) Patent No.: US 7,339,446 B2
(45) Date of Patent: Mar. 4, 2008

(54) TUNABLE RESONATOR WITH MEMS ELEMENT

(75) Inventors: Jun Su, San Jose, CA (US); Dong S. Shim, San Jose, CA (US); Oing Ma, San Jose, CA (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 11/153,998

(22) Filed: Jun. 16, 2005

(65) Prior Publication Data

US 2006/0290445 A1    Dec. 28, 2006

(51) Int. Cl.
*H03H 7/01* (2006.01)
*H03H 2/00* (2006.01)
*H03H 1/00* (2006.01)
*H04B 1/40* (2006.01)

(52) U.S. Cl. .............. 333/174; 333/17.1; 333/235; 333/132; 455/77

(58) Field of Classification Search ............... 333/186, 333/188, 174, 235, 17.1
See application file for complete search history.

(56) References Cited

U.S. PATENT DOCUMENTS

| | | | |
|---|---|---|---|
| 6,049,702 A * | 4/2000 | Tham et al. ................ 455/78 |
| 6,404,304 B1 * | 6/2002 | Kwon et al. ............... 333/202 |
| 6,559,530 B2 * | 5/2003 | Hinzel et al. ............. 257/684 |
| 6,784,766 B2 * | 8/2004 | Allison et al. ............. 333/205 |
| 6,943,419 B2 * | 9/2005 | Wong et al. ............... 257/416 |
| 7,049,902 B2 * | 5/2006 | Myong et al. ............. 333/17.1 |
| 7,135,940 B2 * | 11/2006 | Kawakubo et al. ....... 333/17.1 |
| 7,154,349 B2 * | 12/2006 | Cabanillas ............. 331/117 R |
| 7,155,182 B2 * | 12/2006 | Eckl et al. ............... 455/180.4 |
| 2004/0183624 A1 * | 9/2004 | Liang et al. ............... 333/134 |
| 2005/0017329 A1 * | 1/2005 | Hayworth et al. ......... 257/659 |
| 2006/0001123 A1 * | 1/2006 | Heck et al. ................ 257/528 |

* cited by examiner

*Primary Examiner*—Barbara Summons
(74) *Attorney, Agent, or Firm*—Caven & Aghevli LLC

(57) ABSTRACT

According to an embodiment of the present invention, a microelectromechanical system (MEMS) element tunes a resonator to a frequency.

20 Claims, 5 Drawing Sheets

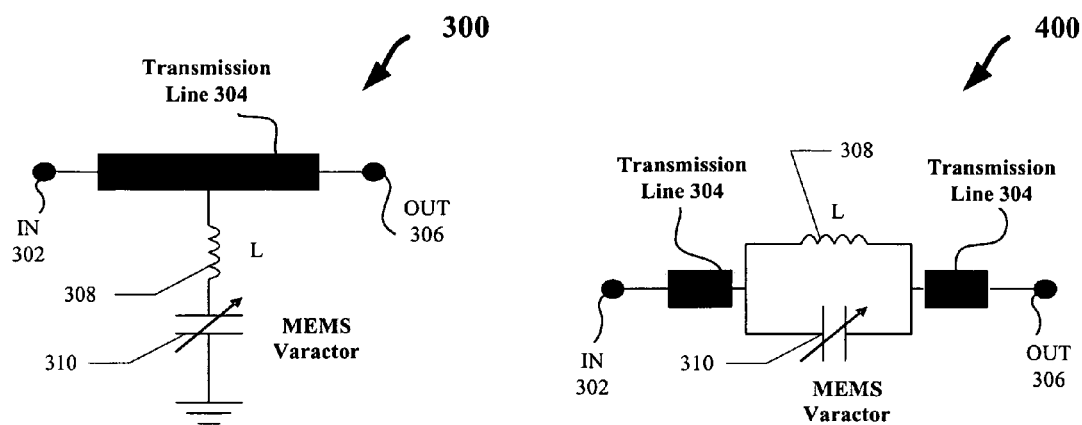
*FIG. 3*
*FIG. 4*
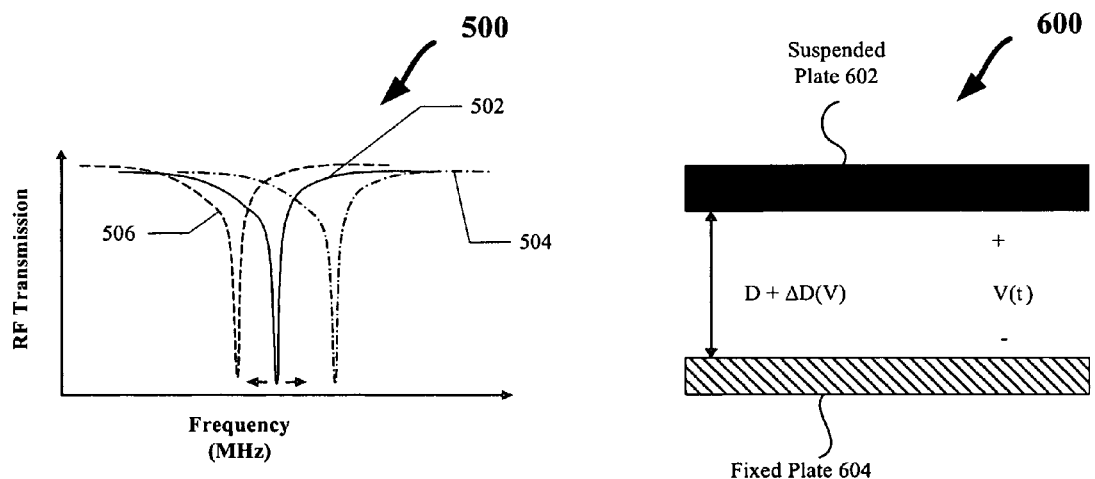
*FIG. 5*
*FIG. 6*

TUNABLE RESONATOR WITH MEMS ELEMENT

BACKGROUND

Electronic filters are generally utilized to reduce or eliminate unwanted frequencies from a signal. Active filters that combine capacitors with inductors may achieve relatively sharper frequency characteristics when compared with non-active filters that combine resistors and capacitors. Active filters find applications in various radio frequency (RF) devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

FIGS. 3, 4, and 7 illustrate circuit diagrams of tunable RF notch filters, in accordance with various embodiments of the present invention.

FIGS. 5, 8, and 10 illustrate graphs of notching characteristics of notch filters that are tuned by MEMS varactors, in accordance with various embodiments of the present invention.

FIG. 6 illustrates a MEMS parallel-plate varactor, in accordance with an embodiment of the present invention.

DETAILED DESCRIPTION

In the following description, numerous specific details are set forth in order to provide a thorough understanding of various embodiments of the present invention. However, it will be understood by those skilled in the art that the various embodiments of the present invention may be practiced without the specific details. In other instances, well-known methods, procedures, components, and circuits have not been described in detail so as not to obscure the particular embodiments of the present invention.

It should be understood that embodiments of the present invention may be used in a variety of applications. Although the present invention is not limited in this respect, the circuits disclosed herein may be used in many apparatus such as in the transmitters and receivers of a radio system. Radio systems intended to be included within the scope of the present invention include, by way of example only, wireless local area networks (WLAN) devices and wireless wide area network (WWAN) devices including wireless network interface devices and network interface cards (NICs), base stations, access points (APs), gateways, bridges, routers, hubs, cellular radiotelephone communication systems, satellite communication systems, two-way radio communication systems, one-way pagers, two-way pagers, personal communication systems (PCS), personal computers (PCs), personal digital assistants (PDAs), and the like, although the scope of the invention is not limited in this respect.

Types of wireless communication systems intended to be within the scope of the present invention include, although not limited to, WLAN, WWAN, code division multiple access (CDMA) cellular radiotelephone communication systems, Global System for Mobile Communications (GSM) cellular radiotelephone systems, North American Digital Cellular (NADC) cellular radiotelephone systems, time division multiple access (TDMA) systems, extended-TDMA (E-TDMA) cellular radiotelephone systems, Third Generation Partnership Project (3GPP or 3G) systems like wideband CDMA (WCDMA), CDMA-2000, and the like, although the scope of the invention is not limited in this respect.

Figure 1:
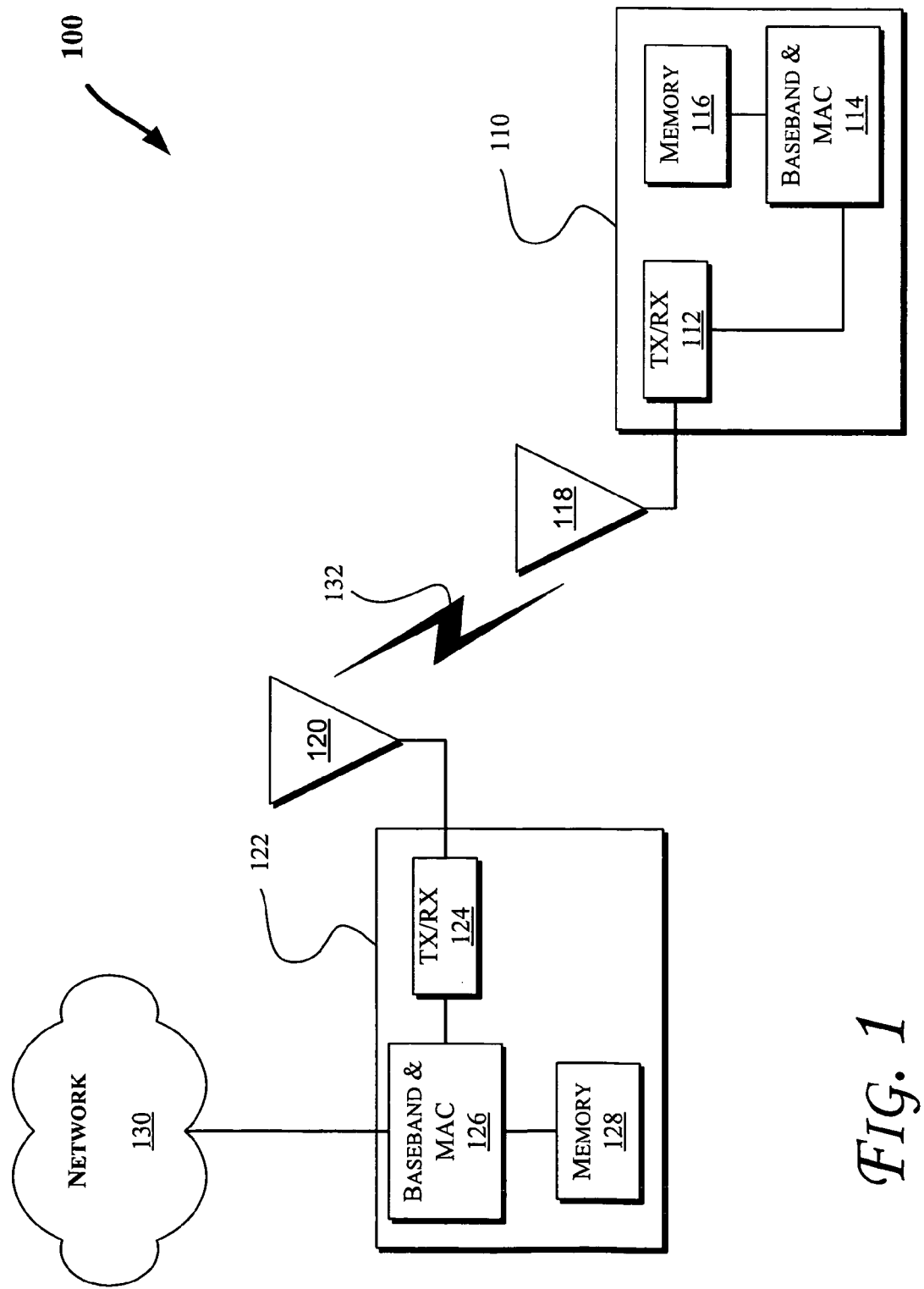
FIG. 1 is a block diagram of a wireless local area or cellular network communication system, in accordance with one or more embodiments of the present invention.

FIG. 1 is a block diagram of a wireless local area or cellular network communication system 100 in accordance with one or more embodiments of the present invention. In the communication system 100 shown in FIG. 1, a mobile unit 110 may include a wireless transceiver 112 coupled to an antenna 118 and to a processor 114 to provide baseband and media access control (MAC) processing functions. The baseband processor 114 may process baseband cellular telephone data and the transceiver 112 may communicate radio frequency signals through the antenna 118. In one embodiment of the present invention, the mobile unit 110 may be a cellular telephone or an information handling system such as a mobile personal computer, a personal digital assistant (PDA), or the like that incorporates a cellular telephone communication module.

The processor 114, in one embodiment of the present invention, may comprise a single processor, or alternatively may comprise one or more processors such as a baseband processor and/or an applications processor. The processor 114 may couple to a memory 116 which may include volatile memory such as dynamic random-access memory (DRAM), non-volatile memory such as flash memory, or alternatively may include other types of storage such as a hard disk drive, although the scope of the invention is not limited in this respect. Furthermore, some portion or all of the memory 116 may be included on the same integrated circuit (IC) as the processor 114, or alternatively some portion or all of the memory 116 may be disposed on an IC or other medium, for example a hard disk drive, that is external to the IC of the processor 114.

The mobile unit 110 may communicate with the access point 122 via a wireless communication link 132, e.g., to communicate RF signals between antennas 118 and 120. The access point 122 may include the antenna 120, a transceiver 124, a processor 126, and memory 128. The transceiver 124 may communicate radio frequency signals through the antenna 120. In one embodiment of the present invention, the access point 122 may be a base station of a cellular telephone network. In an embodiment of the present invention, the access point 122 may be an access point or wireless router of a wireless local or personal area network, although the scope of the invention is not limited in this respect.

In an embodiment of the present invention, the access point 122 and optionally the mobile unit 110 may include two or more antennas, for example to provide a spatial division multiple access (SDMA) system or a multiple input, multiple output (MIMO) system. The access point 122 may couple with the network 130 so that the mobile unit 110 may communicate with the network 130, including devices coupled to the network 130, by communicating with the access point 122 via the wireless communication link 132. The network 130 may include a public network such as a telephone network or the Internet, or alternatively the network 130 may include a private network such as an intranet, or a combination of a public and a private network.

Additionally, communication between the mobile unit 110 and the access point 122 may be implemented via a wireless local area network (WLAN), for example a network compliant with an Institute of Electrical and Electronics Engineers (IEEE) standard and/or a high performance LAN (HIPERLAN), such as IEEE 802.11a (IEEE 802.11a-1999, published May 1, 1999), IEEE 802.11b (IEEE 802.11b-1999, published Jan. 1, 1999, as amended by IEEE 802.11b-1999/Cor1-2001 on Oct. 10, 2001), HIPERLAN-II (European Telecommunications Standards Institute (ETSI) TR 101 957, published Aug. 1, 2001), and the like. In one embodiment of the present invention, communication between the mobile unit 110 and access point 122 may be partially implemented via a cellular communication network compliant with a Third Generation Partnership Project (3GPP or 3G) standard. In one or more embodiments of the invention, the antenna 118 may be utilized in a wireless sensor network or a mesh network. Furthermore, in accordance with one or more embodiments of the present invention, such as those discussed with reference to the remaining figures herein, the mobile unit 110 and/or the access point 122 may include a microelectromechanical systems (MEMS) element (such as a varactor or switch) that is integrated with various circuit elements (such as one or more inductors and/or capacitors) to provide a tunable filter.

Figure 2:
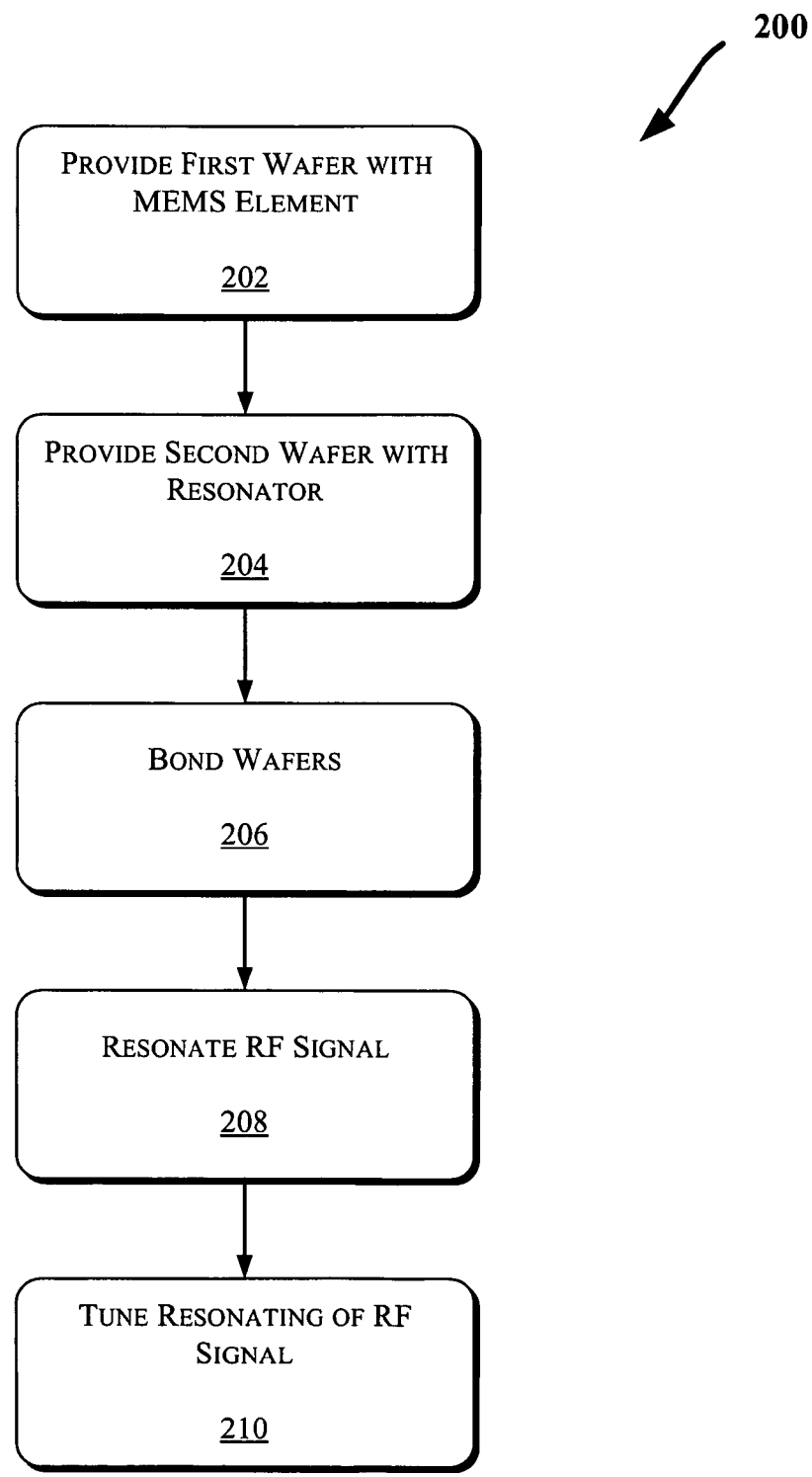
FIG. 2 illustrates a method of providing a tunable filter, in accordance with one or more embodiments of the present invention.

FIG. 2 illustrates a method 200 of providing a tunable filter, in accordance with one or more embodiments of the present invention. In one embodiment of the present invention, the tunable filter may be any suitable tunable (or active) filter to filter RF signals such as a band-pass filter, a band-stop filter (including a notch filter), a low-pass filter, a high-pass filter, and the like. In an embodiment of the present invention, the tunable filter discussed with reference to FIG. 2 may be provided within the transceivers 112 and/or 124 of FIG. 1, e.g., to filter wireless (e.g., RF) signals communicated via the communication link 132 of FIG. 1.

The method 200 provides a first wafer with a MEMS element (202), such as a varactor or switch, and a second wafer with a resonator (204), such as one or more inductors and/or capacitors. The two wafers may be bonded (206) to provide a tunable filter. The bonding of the wafers (206) will be further discussed with reference to FIG. 11. The resonator may resonate an RF signal (208) such as those discussed with reference to FIG. 1. And the MEMS element may tune the resonance (or resonating) of the RF signal (210), e.g., by acting as a frequency control element. In one embodiment of the present invention, the frequency tuning (210) may be performed continuously. Moreover, the MEMS element and the resonator may be provided on a single IC chip. Also, as will be further discussed with reference to FIG. 7, the stage 210 that tunes the resonance (or resonating) of the RF signal may be performed via selection of the capacitance of the MEMS element. Utilization of MEMS technology in a filter may provide lower insertion loss.

FIG. 3 illustrates a circuit diagram of a tunable RF notch filter 300, in accordance with an embodiment of the present invention. The notch filter 300 may be utilized to attenuate all frequencies between two limits and pass all frequencies not within the limits. The limits may be non-zero and finite. Even though in various embodiments of the present invention discussed herein, a notch filter is utilized for illustrative purposes, other suitable tunable filters may be utilized such as a band-pass filter, other band-stop filters, a low-pass filter, a high-pass filter, and the like.

The notch filter 300 may receive a signal (such as an RF signal) at an input node 302 and propagate the signal through a transmission line 304 to an output node 306. The transmission line 304 may be coupled to an inductor 308 and a MEMS varactor 310. In one embodiment of the present invention, the combination of the inductor 308 and the MEMS varactor 310 forms a tunable notch filter.

FIG. 4 illustrates a circuit diagram of a tunable RF notch filter 400, in accordance with an embodiment of the present invention. As illustrated in FIG. 4, the notch filter 400 includes the input node 302, transmission line(s) 304, output node 306, inductor 308, and the MEMS varactor 310. In one embodiment of the present invention, the notch filter 400 may provide an equivalent circuit for the notch filter 300 of FIG. 3 that is in-line with the transmission line 304.

FIG. 5 illustrates a graph 500 of notching characteristics of a notch filter that is tuned by a MEMS varactor, in accordance with an embodiment of the present invention. In one embodiment of the present invention, the graph 500 illustrates the notching characteristics (RF transmission versus the frequency) of the notch filters 300 and/or 400 discussed with reference to FIGS. 3-4. As illustrated in FIG. 5, an original signal 502 (solid line) may be tuned up or down (illustrated by dotted lines 504 and 506, respectively). The y-axis of the graph 500 may utilize any suitable RF transmission unit such as one on a logarithmic scale (e.g., decibels) or a ratio of the output voltage at the output node 306 of FIG. 3 or 4 over the input voltage at the input node 302 of FIG. 3 or 4 (Vout/Vin). The x-axis of the graph 500 may also utilize any suitable frequency unit such as Hertz (Hz), kilo Hertz (kHz), mega Hertz (MHz), giga Hertz (GHz), and the like.

FIG. 6 illustrates a MEMS parallel-plate varactor 600, in accordance with an embodiment of the present invention. In one embodiment of the present invention, the MEMS varactor 600 may be utilized as the MEMS varactor 310 to tune the notch filters 300 and 400 of FIGS. 3 and 4, respectively. The MEMS varactor 600 includes a suspended plate 602 and a fixed plate 604. The distance between the suspended plate 602 and the fixed plate 604 may be adjusted based on the voltage potential (V(t)) present across the plates.

In one embodiment of the present invention, the RF resonance frequency ($f_0$) of the MEMS varactors (310 and/or 600) discussed with reference to FIGS. 3-6 may be characterized by $$f_0 = \frac{1}{[2\pi\sqrt{LC}]}$$

and tuned with capacitance C as a function of voltage as indicated in FIG. 6. Hence, the MEMS elements discussed herein may be voltage-controlled elements to adjust or control the frequency of a filter.

For a MEMS parallel-plate capacitor (e.g., the varactor 310 of FIGS. 3-4 or varactor 600 of FIG. 6), its capacitance may be expressed as: $C(V) = \epsilon A/[D + \Delta D(V)]$, where $\epsilon$ is the dielectric constant of the interplate medium, A is the area of the capacitor plates, D is the interpolate distance, and $\Delta D(V)$ is the variation of interplate distance caused by MEMS actuation. In one embodiment of the present invention, such a configuration may provide a relatively smooth tuning notch frequency with variation of voltage (e.g., across the plates 602 and 604 of FIG. 6). Tunability of the RF notch filters (e.g., notch filters 300 or 400 of FIG. 3 or 4, respectively) may also be realized in an embodiment of the present invention as shown in FIG. 7.

Figures 7, 8:
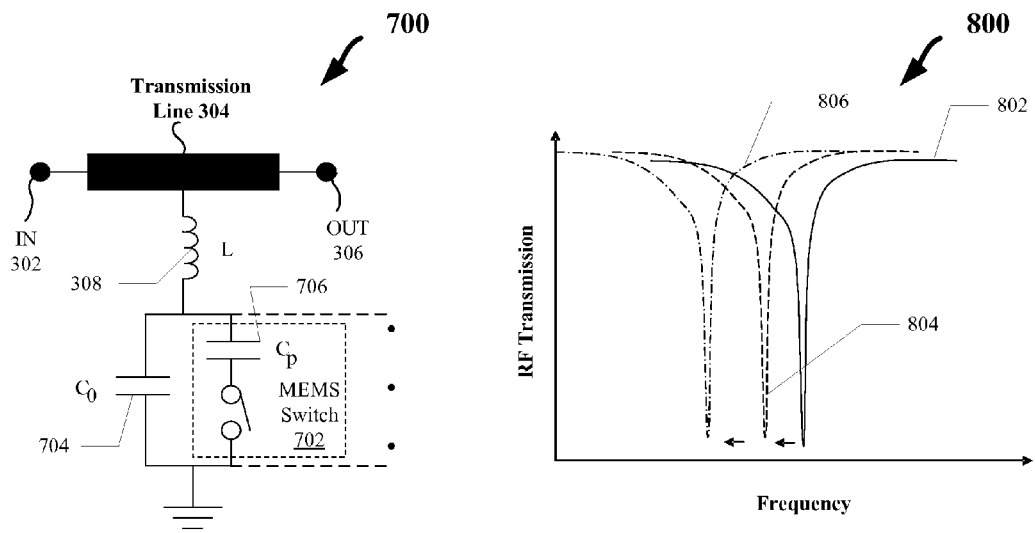

FIG. 7 illustrates a circuit diagram of a tunable RF notch filter 700, in accordance with an embodiment of the present invention. As illustrated in FIG. 7, before a MEMS switch 702 is actuated, the notch filter 700 may operate at a frequency of $1/[2\pi(LC_O)^{0.5}]$ since a capacitor 704 ($C_O$) is in series with the inductor 308. Once the switch (702) is on, the equivalent capacitance of the notch filter 700 increases to the parallel equivalent of capacitors 704 and 706 ($C_O+C_p$), where $C_p$ (706) is the equivalent capacitance of the MEMS switch 702. As a result, the operation frequency may be tuned down accordingly, such as illustrated in FIG. 8.

FIG. 8 illustrates a graph 800 of notching characteristics of a notch filter that is tuned by a MEMS varactor, in accordance with an embodiment of the present invention. In one embodiment of the present invention, the graph 800 illustrates the notching characteristics (RF transmission versus the frequency) of the notch filter 700 discussed with reference to FIG. 7. As illustrated in FIG. 8, an original signal 802 (solid line) may be repeatedly tuned down (illustrated by dotted lines 804 and 806). The y-axis of the graph 800 may utilize any suitable RF transmission unit such as one on a logarithmic scale (e.g., decibels) or a ratio of the output voltage at the output node 306 of FIG. 7 over the input voltage at the input node 302 of FIG. 7 (Vout/Vin). The x-axis of the graph 800 may also utilize any suitable frequency unit such as Hertz (Hz), kilo Hertz (kHz), mega Hertz (MHz), giga Hertz (GHz), and the like.

In an embodiment of the present invention, continuous tuning of the notch filter 700 of FIG. 7 may be achieved by including multiple MEMS switches 702, which may include a bank of equivalent capacitors (706) in parallel. In one embodiment of the present invention, this technique may be applied to modify the equivalent inductance of the notch filters (e.g., the notch filters 300, 400, and 700 of FIGS. 3, 4, and 7, respectively) to tune the notch frequency of the filters in consideration of potential changes in the Q factor of equivalent inductors.

Figure 9:
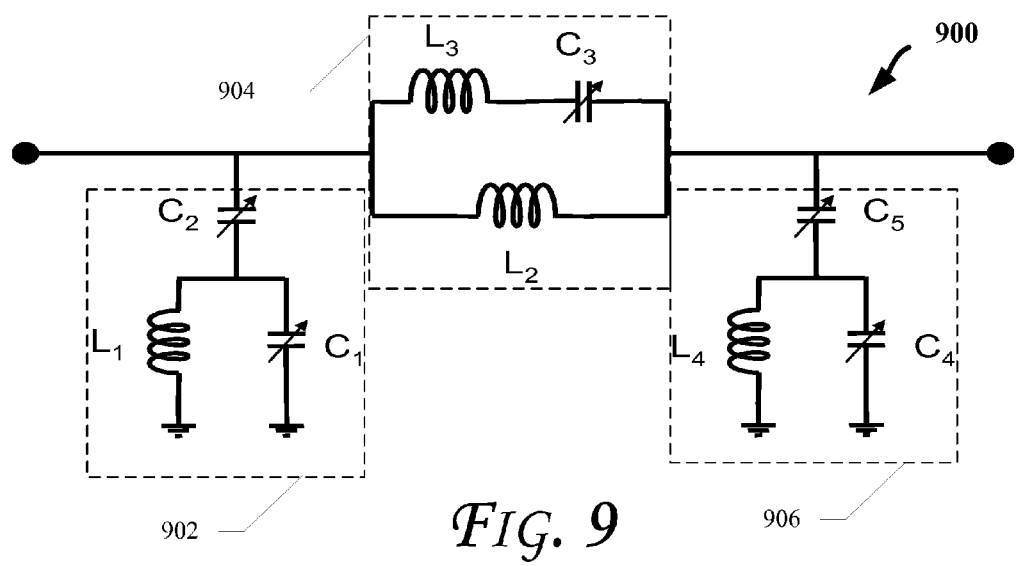
FIG. 9 illustrates a circuit diagram of a tunable notch filter with a plurality of incorporated notch filters, in accordance with an embodiment of the present invention.

FIG. 9 illustrates a circuit diagram of a tunable notch filter 900 with a plurality of incorporated notch filters, in accordance with an embodiment of the present invention. As illustrated in FIG. 8, various individual notch filters (e.g., 902, 904, and/or 906) may be coupled to provide a single notch filter (900). In an embodiment of the present invention, the notch filter 900 provides relatively more rejection than implementations that may utilize fewer individual notch filters (e.g., 902, 904, and/or 906).

Figure 10:
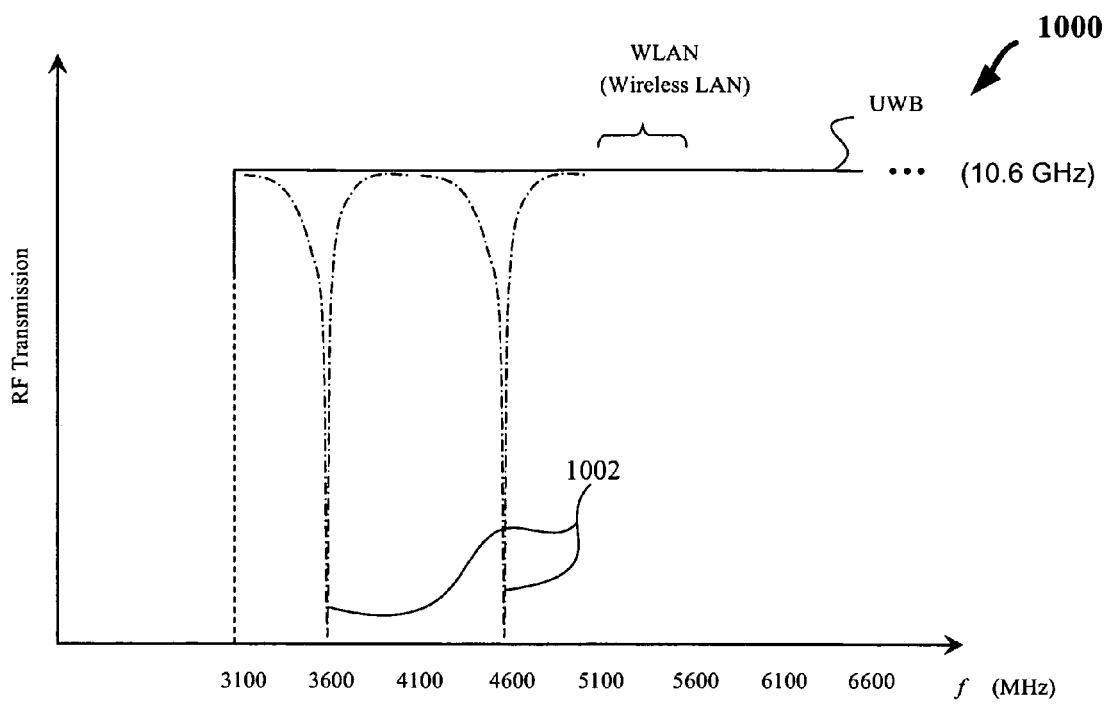

FIG. 10 illustrates a graph 1000 of notching characteristics of a notch filter that is tuned by a MEMS varactor, in accordance with an embodiment of the present invention. In one embodiment of the present invention, the graph 1000 illustrates the notching characteristics (RF transmission versus the frequency) of a notch filter that is tuned by utilizing a MEMS element (e.g., a switch and/or varactor) that is voltage-controlled, such as those discussed with reference to FIGS. 2-9. In an embodiment of the present invention, the graph 1000 illustrates notching characteristics provided by the techniques discussed herein that may be deployed in ultra-wideband (UWB) communications. For example, given the frequency band from 3.1 GHz to 10.6 GHz and per the current requirements of the Federal Communication Commission (FCC) that UWB signals be at least 500 MHz, the graph 1000 illustrates that the tunable RF notch filters with MEMS voltage control elements such as described herein may be tuned to suppress multiple interfering signals (1002) within a selected frequency range, e.g., up to 10.6 GHz.

As illustrated in FIG. 10, the y-axis of the graph 1000 may utilize any suitable RF transmission unit such as one on a logarithmic scale (e.g., decibels) or a ratio of the output voltage at the output node 306 of FIGS. 3-4, or 7 over the input voltage at the input node 302 of FIGS. 3-4, or 7 (Vout/Vin). The x-axis of the graph 1000 may also utilize any suitable frequency unit such as Hertz (Hz), kilo Hertz (kHz), mega Hertz (MHz), giga Hertz (GHz), and the like.

Figure 11:
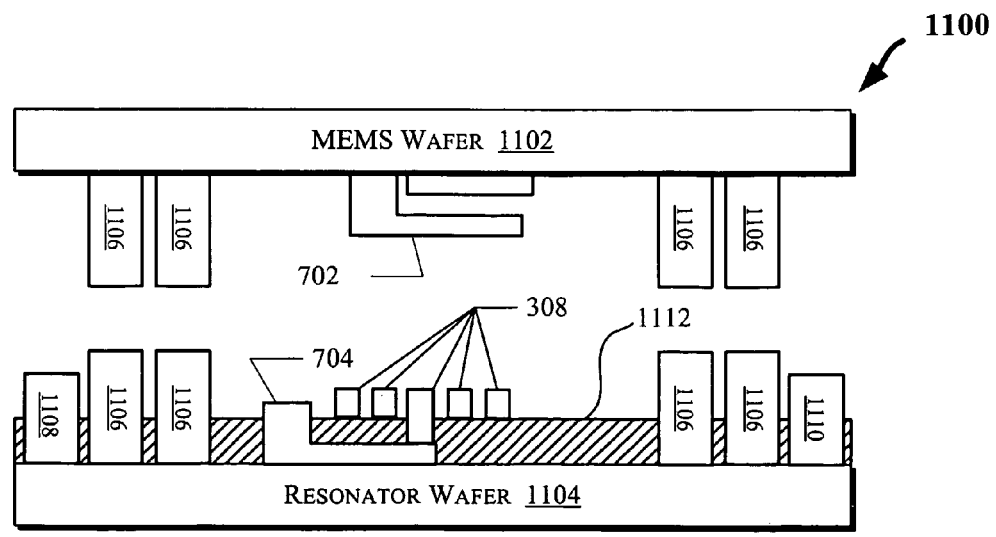
FIG. 11 illustrates a cross-sectional side view of a semiconductor device, in accordance with an embodiment of the present invention.

FIG. 11 illustrates a cross-sectional side view of a semiconductor device 1100, in accordance with an embodiment of the present invention. In one embodiment of the present invention, the semiconductor device 1100 may be a tunable notch filter such as the notch filter 700 discussed with reference to FIG. 7. Also, as discussed with reference to FIG. 2, a tunable filter may be provided by bonding a first wafer (1102) that may include the MEMS switch 702 with a second wafer (1104) with a resonator (e.g., including the capacitor 704 and the inductor 308). The wafers 1102 and 1104 may be any suitable type of a wafer such as a complimentary metal-oxide semiconductor (CMOS) wafer, a Gallium Arsenide wafer, and/or a Silicon Germanium wafer.

In one embodiment of the present invention, the bonding of the MEMS wafer 1102 and the resonator wafer 1104 may be done by bonding one or more bond pads 1106. In an embodiment of the present invention, seal rings may be utilized to bond the bond pads 1106. As illustrated in FIG. 11, the bond pads 1106 may be present on the MEMS wafer 1102 and the resonator wafer 1104. The bond pads 1106 may be electrically conductive to route signals such as those discussed with reference to FIG. 7. Hence, the MEMS switch 702 may be coupled to the capacitor 704 through the bond pads 1106. Also, as illustrated in FIGS. 7 and 11, the capacitor 704 and the inductor 308 may be directly coupled. The inductor 308 may be a spiral inductor in one embodiment of the present invention.

Furthermore, the resonator wafer 1104 may include an input pad 1108 (e.g., to provide the input node 302 of FIG. 7) and an output pad 1110 (e.g., to provide the output node 306 of FIG. 7). The semiconductor device 1100 may also include insulating material 1112 to electrically isolate one or more components of the device 1100. For example, the input pad 1108 and the output pad 1110 may be electrically isolated from the bond pads 1106 on the resonator wafer 1104. Moreover, there may be one or more buried lateral feedthroughs (LFTs) (not shown) to couple the capacitor 704 to ground (e.g., routed through the resonator wafer 1104) and the inductor 308 to the transmission line 304 (e.g., routed through the resonator wafer 1104).

Reference in the specification to "one embodiment of the present invention" or "an embodiment of the present invention" means that a particular feature, structure, or characteristic described in connection with the embodiment of the present invention is included in at least an implementation. The appearances of the phrase "in one embodiment of the present invention" in various places in the specification may or may not be all referring to the same embodiment of the present invention.

Also, in the description and claims, the terms "coupled" and "connected," along with their derivatives, may be used. In some embodiments of the present invention, "connected" may be used to indicate that two or more elements are in direct physical or electrical contact with each other.

"Coupled" may mean that two or more elements are in direct physical or electrical contact. However, "coupled" may also mean that two or more elements may not be in direct contact with each other, but may still cooperate or interact with each other.

Thus, although embodiments of the present invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
a resonator to resonate a radio frequency signal;
a microelectromechanical system element to tune the resonator to a frequency, wherein the microelectromechanical system element is provided on a first wafer and the resonator is provided on a second wafer;
a plurality of bonding pads to electrically bond the first and second wafers; and
a plurality of seal rings to bond the plurality of bonding pads.

2. The apparatus of claim 1, wherein the plurality of bonding pads are to route signals between the first and second wafers.

3. The apparatus of claim 1, wherein the first and second wafers are one or more of a complimentary metal-oxide semiconductor wafer, a Gallium Arsenide wafer, or a Silicon Germanium wafer.

4. The apparatus of claim 1, wherein the first and second wafers are bonded to form a tunable filter.

5. The apparatus of claim 1, wherein the microelectromechanical system element tunes the resonator to the frequency via selection of a capacitance of the microelectromechanical system element.

6. The apparatus of claim 1, wherein the microelectromechanical system element is a microelectromechanical system varactor or a microelectromechanical system switch.

7. The apparatus of claim 1, wherein the resonator comprises one or more of an inductor or a capacitor.

8. The apparatus of claim 1, wherein the apparatus is a band-pass filter, a band-stop filter, a low-pass filter, or a high-pass filter.

9. The apparatus of claim 1, wherein the apparatus is provided on an integrated circuit.

10. A method comprising:
resonating a radio frequency signal; and
tuning the resonating of the radio frequency signal with a microelectromechanical system element, wherein:
tuning the resonating of the radio frequency signal is performed by the microelectromechanical system element on a first wafer;
resonating the radio frequency is performed by a resonator on a second wafer electrically coupling the first and second wafers through a plurality of bonding pads; and
bonding the plurality of bonding pads with a plurality of seal rings.

11. The method of claim 10, wherein tuning the resonating of the radio frequency signal is performed continuously.

12. The method of claim 10, wherein first and second wafers are bonded to form a tunable filter.

13. The method of claim 12, further comprising routing signals between the first and second wafers through the plurality of bonding pads.

14. The method of claim 10, wherein the microelectromechanical system element and the resonator are on an integrated circuit.

15. The method of claim 10, wherein tuning the resonating of the radio frequency signal is performed via selection of a capacitance of the microelectromechanical system element.

16. The method of claim 10, wherein resonating the radio frequency signal is performed by one or more of an inductor or a capacitor.

17. A system comprising:
a baseband processor to process baseband cellular telephone data;
a transceiver to couple to the baseband processor and communicate a radio frequency signal via an antenna, the transceiver comprising:
a resonator to resonate the radio frequency signal; and
a microelectromechanical system element coupled to the resonator to tune the resonator to a frequency, wherein the microelectromechanical system element is provided on a first wafer and the resonator is provided on a second wafer, wherein a plurality of bonding pads are to electrically bond the first and second wafers, and wherein a plurality of seal rings are to bond the plurality of bonding pads.

18. The system of claim 17, wherein the system comprises two or more antennas coupled to the transceiver to communicate via a wireless communication link.

19. The system of claim 17, wherein the system is an access point or a mobile unit.

20. The system of claim 19, wherein the mobile unit is a mobile personal computer, a cellular phone, or a personal digital assistant.

* * * * *

UNITED STATES PATENT AND TRADEMARK OFFICE
CERTIFICATE OF CORRECTION

PATENT NO. : 7,339,446 B2 Page 1 of 1
APPLICATION NO. : 11/153998
DATED : March 4, 2008
INVENTOR(S) : Su et al.

It is certified that error appears in the above-identified patent and that said Letters Patent is hereby corrected as shown below:

On the face page, in field (75), in "Inventors", line 2, delete "Oing" and insert -- Qing --, therefor.

Signed and Sealed this

First Day of July, 2008

JON W. DUDAS
*Director of the United States Patent and Trademark Office*